(12) United States Patent
Cho (10) Patent No.: US 8,803,212 B2
(45) Date of Patent: Aug. 12, 2014

(54) THREE-DIMENSIONAL CROSSBAR ARRAY

(75) Inventor: Hans S. Cho, Oakland, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 361 days.

(21) Appl. No.: 13/209,606

(22) Filed: Aug. 15, 2011

(65) Prior Publication Data

US 2013/0043056 A1    Feb. 21, 2013

(51) Int. Cl.
| H01L 27/108 | (2006.01) |
| H01L 29/04 | (2006.01) |
| H01L 29/792 | (2006.01) |
| H01L 23/62 | (2006.01) |
| H01L 45/00 | (2006.01) |
| G11C 13/00 | (2006.01) |

(52) U.S. Cl.
CPC .............. *H01L 45/08* (2013.01); *H01L 45/146* (2013.01); *G11C 2213/77* (2013.01); *H01L 45/1616* (2013.01); *H01L 45/1683* (2013.01); *G11C 13/0007* (2013.01); *H01L 45/1233* (2013.01); *G11C 2213/71* (2013.01)
USPC ................ 257/306; 257/3; 257/324; 257/357

(58) Field of Classification Search
CPC ............ H01L 45/1683; H01L 45/1233; H01L 45/146; H01L 45/1616; H01L 45/08; G11C 13/0007; G11C 13/71; G11C 13/77
USPC ...................... 257/306, 3, 324, 357
See application file for complete search history.

(56) References Cited

U.S. PATENT DOCUMENTS

| 2005/0167699 A1* | 8/2005 | Sugita et al. .................. 257/202 |
| 2006/0268594 A1* | 11/2006 | Toda ............................. 365/100 |
| 2008/0079029 A1* | 4/2008 | Williams ....................... 257/213 |
| 2008/0173932 A1* | 7/2008 | Kidoh et al. .................. 257/324 |
| 2010/0032641 A1* | 2/2010 | Mikawa et al. .................... 257/3 |
| 2010/0270528 A1* | 10/2010 | Yoo et al. ........................... 257/3 |
| 2011/0017977 A1* | 1/2011 | Bratkovski et al. ............. 257/14 |
| 2011/0169136 A1* | 7/2011 | Pickett et al. ................. 257/537 |

OTHER PUBLICATIONS

Hang-Ting Lue, Charge-Trapping (CT) Flash and 3D NAND Flash, Macronix International Co., Ltd. Hsinchu, Taiwan.

Hong Sik Yoon, In-Gyu Baek, Jinshi Zhao, Hyunjun Sim, Min Young Park, Hansin Lee, Gyu-Hwan Oh, Jong Chan Shin, In-Seok Yeo, and U-In Chung, "Vertical Cross-point Resistance Change Memory for Ultra-High Density Non-volatile Memory Applications". Process Development Team, Memory R&D Center, Semiconductor Business, Samsung Electronics Co. Ltd. San #24, Nongseo-Dong, Giheung-Gu, Yongin-City, Gyunggi-Do 446-711, Korea. 2009, pp. 26-27.

Jiyoung Kim, Augustin J. Hong, Sung Min Kim, Emil B. Song, Jeung Hun Park, Jeonghee Han, Siyoung Choi, Deahyun Jang, Joo-Tae Moon, and Kang L .Wang. "Novel Vertical-Stacked-Array-Transistor (VSAT) for ultra-high-density and cost-effective NAND Flash memory devices and SSD (Solid State Drive)". Department of Materials Science and Engineering, UCLA , Process Development Team, Samsung Electronics Co., Korea. 2009, pp. 186-187.

* cited by examiner

Primary Examiner — Long K Tran
Assistant Examiner — Dzung Tran (57) ABSTRACT

A three-dimensional crossbar array may include a metal layer, and an insulator layer disposed adjacent the metal layer. A trench may be formed in the metal layer to create sections in the metal layer, and a portion of the trench may include an insulator. A hole may be formed in the trench and contact a section of the metal layer. The hole may define a via. A contact region between the via and the section of the metal layer may define a crossbar array.

20 Claims, 13 Drawing Sheets

THREE-DIMENSIONAL CROSSBAR ARRAY

BACKGROUND

Memristor and two-terminal devices generally may utilize a crossbar configuration including a switching material or device disposed between two conducting electrodes that overlap one another perpendicularly. Since such devices do not need a single-crystal silicon or a monolithic substrate, they can be integrated at a greater density compared to standard microelectronic devices when using a stacked three-dimensional structure. The stacking capability can lead to advances in the storage capacity, for example, of memory chips. However, stacking multiple layers of crossbar structures may need a number of lithography process steps proportional to the number of layers stacked, which can add expense to devices using such crossbar structures.

For example, fabrication of a single plane of crossbar arrays may generally use two or more lithography steps. Therefore, stacking multiple (e.g., N) layers of the single plane of crossbar arrays may use at least 2*N lithography steps. Additional lithography steps may be needed to form vias that contact these arrays. A via is a vertical electrical connection between different layers of conductors, for example, in a printed circuit board. For an eight layer stacked architecture, therefore, upwards of sixteen lithography steps may be needed. As discussed above, such multiple steps can add expense to devices using such crossbar structures that may include multiple layers.

BRIEF DESCRIPTION OF DRAWINGS

The embodiments are described with reference to the following figures.

DETAILED DESCRIPTION OF EMBODIMENTS

For simplicity and illustrative purposes, the principles of the embodiments are described by referring mainly to examples thereof. In the following description, numerous specific details are set forth in order to provide a thorough understanding of the embodiments. It will be apparent that the embodiments may be practiced without limitation to all the specific details. Also, the embodiments may be used together in various combinations.

1. Overview

Memristor and other non-silicon-based two-terminal devices may utilize a stacked three-dimensional structure because their active channels may include materials that can be deposited as thin films, and may be independent of a silicon substrate, unlike silicon-based devices such as, for example, NAND Flash or DRAM devices. The stacking capability can lead to advances in the storage capacity, for example, of memory chips. However, stacking multiple layers of crossbar structures may need a number of lithography process steps proportional to the number of layers stacked, which can add expense to devices using such crossbar structures utilizing multiple layers.

A three-dimensional crossbar array and a fabrication method thereof is provided for reducing the number of lithography steps. The three-dimensional crossbar array may include an insulator layer and a metal layer, or alternatively, a plurality of alternating insulator and metal layers disposed adjacent each other. The vertically integrated crossbar geometry of the three-dimensional crossbar array may include multiple stacked horizontal metal lines and vertical via lines. It should be noted that the terms horizontal and vertical, and any reference to a dimension or coordinate system are provided solely for facilitating an understanding of the three-dimensional crossbar array and the fabrication method thereof. The group of parallel metal lines in the horizontal direction of the crossbar structure may be realized by stacking alternating layers of metal and insulator, patterning the stacks into stripes, and etching vertically to form mesas that include stacks of isolated horizontal metal lines. The remaining volume between the mesas may be filled with insulator material. The vertical via lines may be realized by etching holes vertically into the substrate such that they partially overlap and contact the metal lines. The holes may extend fully or partially through the crossbar array. The sidewalls of the vias may then be coated with memristive metal-oxide film, and the interior may be filled with a metal core. The overlap of the horizontal and vertical lines may therefore be comparable to a memristor structure, that is, a (metal electrode)-(metal-oxide film)-(metal electrode) junction.

The three-dimensional crossbar array may include a metal layer, and an insulator layer disposed adjacent the metal layer. A trench may be formed in the metal layer to create sections in the metal layer, and a portion of the trench may include an insulator. The sections may be referred to as metal lines, and are described in further detail below. A hole may be formed in the trench and contact a section of the metal layer. The hole may define a via. A contact region between the via and the section of the metal layer may define a crossbar array. The metal layer may be formed of a homogeneous material, or instead may be formed of a heterogeneous stack of materials including, for example, a combination of Platinum (Pt), Titanium Nitride (TiN), Tungsten (W), Copper (Cu), Tantalum Nitride (TaN), Titanium (Ti), Tantalum (Ta), Aluminum (Al) and metal oxides such as Ti4O7. The sections of the metal layer may be isolated from each other.

Fabrication of a single plane of crossbar arrays may generally use two or more lithography steps. Therefore, stacking multiple (e.g., N) layers of the single plane of crossbar arrays may use at least 2*N lithography steps. Additional lithography steps may be needed to form vias that contact these arrays. For an eight layer stacked architecture, therefore, upwards of sixteen lithography steps may be used. The three-dimensional crossbar array described herein may provide for increase in the integration density, for example, for a microelectronic chip (i.e., memory) device by stacking, with a smaller and fixed number of lithography steps. The number of lithography steps for the three-dimensional crossbar array may be independent of the number of stacked layers, as the crossbar array structure may allow for lithography steps to simultaneously define features encompassing multiple layers.

The crossbar architecture for the three-dimensional crossbar array may realize stacked three-dimensional integration of memristive, or other types of two-terminal devices, at an increased density compared to stacked integration of the single plane of crossbar arrays. This is because the same amount of stacking density may be achieved with a smaller number of lithography masking steps or sequences, therefore reducing cost and fabrication complexity. As discussed above, the number of lithography sequences needed in the fabrication may be fixed regardless the number of layers that are stacked.

An example is provided for estimating densities that can be expected from the three-dimensional crossbar array architecture. For example, assuming a structure has eight stacked horizontal layers, assumptions regarding the lithography constraints may be determined as follows. Since the vias may be etched between the horizontal lines, and there are possibly branched extensions of the horizontal lines, the pitch of the horizontal lines may be assumed to be 4 F, assuming the lines themselves are of width 1~1.5 F. Depending on the series resistance constraints of the lines, the width of the horizontal lines may vary, and therefore the pitch of the horizontal lines may range between 3 F~5 F. The pitch of the vias may be set at approximately 3 F, but may be as small as 2 F. Taking into account the base assumed values above, in the area of 4 F times 3 F=12 $F^2$, one via may contact one stack of eight devices, which gives the area of 1.5 $F^2$ per device. When the number of stacked layers increases, for example, to sixteen, the area per device may decrease to 0.75 $F^2$. However, calculating using the low values may result in eight (or sixteen) stacked devices in 6 $F^2$, leading to half of the above densities. Thus regardless of the number of stacked layers, the number of lithography sequences may remain constant at approximately three to fabricate the crossbar structure itself, or approximately seven-eight to fabricate connections to devices external to the crossbar structure.

2. Structure and Method

Figure 1:
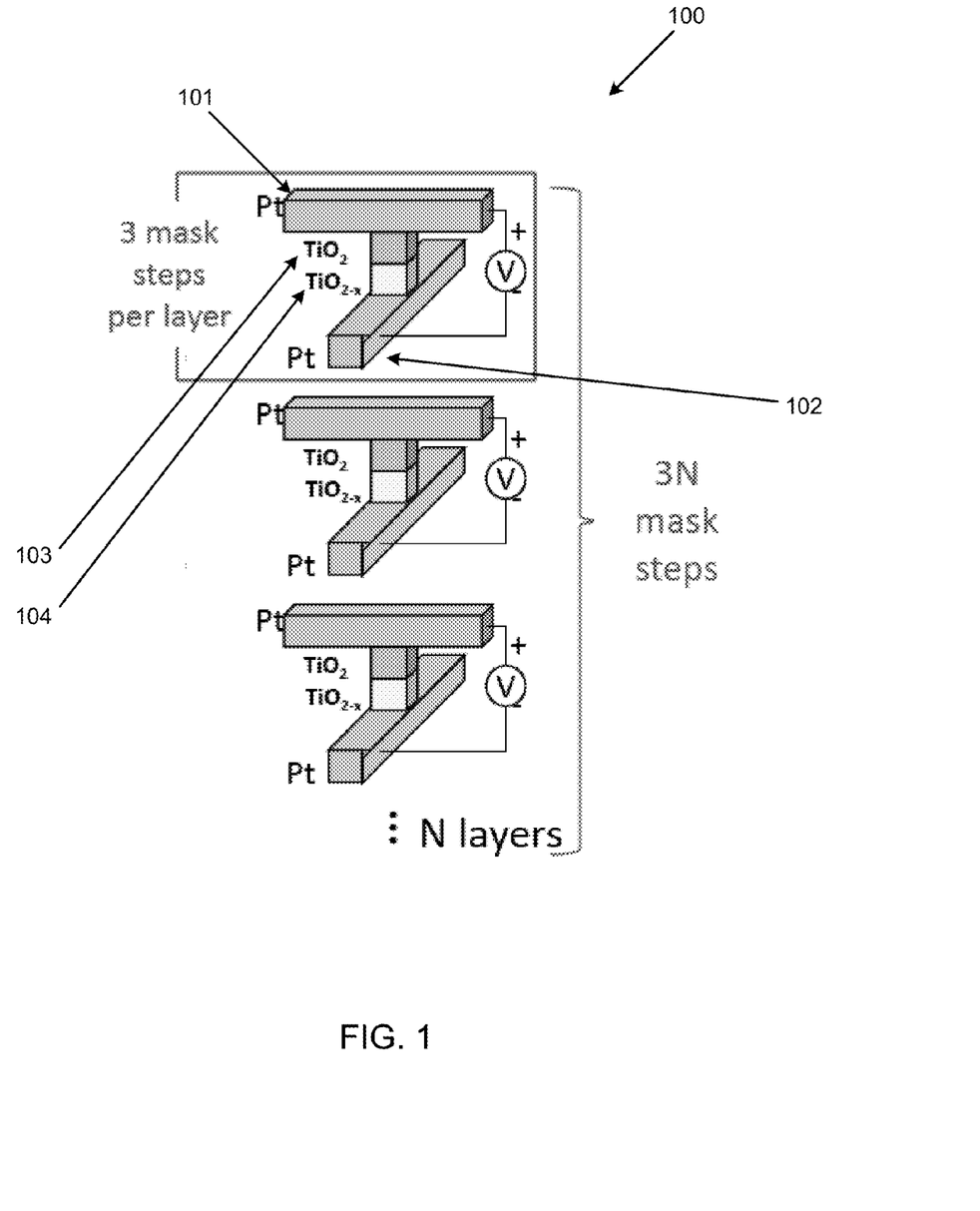
FIG. 1 illustrates a structure for a two-terminal device, according to an embodiment.

FIG. 1 illustrates a structure for a two-terminal device 100, such as a memristor, according to an embodiment. Referring to FIG. 1, each layer of the device 100 may include platinum (Pt) electrodes 101, 102, and sandwiched there-between titanium dioxide ($TiO_2$ and $TiO_{2-x}$) layers 103, 104. Other metals or combinations of metals may be used for the electrodes. The $TiO_{2-x}$ layer 104 may be designated the conductor region and include oxygen vacancies. Under an electric field, the oxygen vacancies may migrate toward the $TiO_2$ layer 103. Each layer of the two-terminal device 100 may need three mask steps per layer. For example, for a device 100 with N layers, a minimum of two and a maximum of four masking steps may be needed. The minimum number of masking steps may be based on elimination of the masking step for the middle $TiO_2$ and $TiO_{2-x}$ layers. Thus for the two-terminal device 100 with N layers, 3N masking steps may be needed.

Figure 2A:
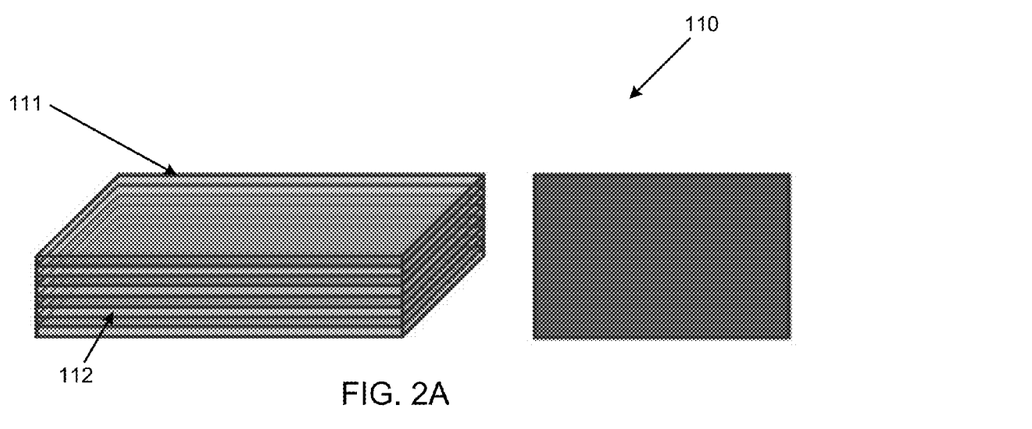
FIGS. 2A-2C illustrate a three-dimensional crossbar array with vertical via lines and a fabrication method thereof, according to an embodiment.
Figure 2B:
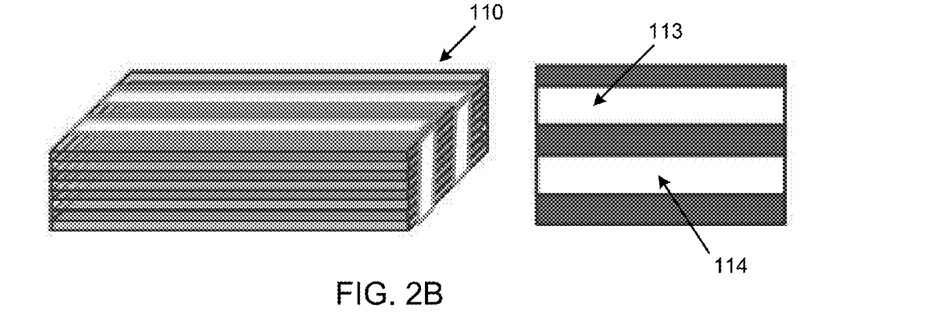
Figure 2C:
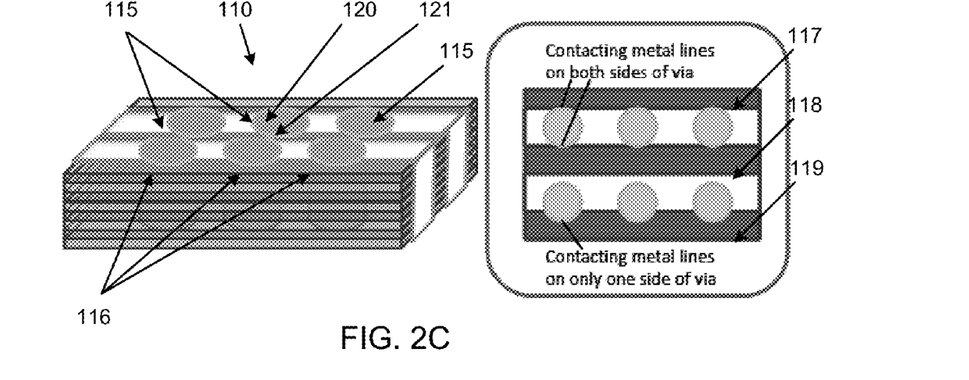

FIGS. 2A-2C illustrate a three-dimensional stacked crossbar array 110 with vertical via lines and a fabrication method thereof, according to an embodiment. Referring to FIGS. 2A-2C, a profile view is shown at the left hand side and a top view is shown at the right hand side. As shown in FIG. 2A, the stacked crossbar array 110 may include deposited alternating layers of metal 111, such as, for example, Platinum (Pt), Titanium Nitride (TiN), Tungsten (W), Copper (Cu), Tantalum Nitride (TaN), Titanium (Ti), Tantalum (Ta), Aluminum (Al) and metal oxides such as, for example, Ti4O7, and insulator 112 such as, for example, Silicon Dioxide ($SiO_2$), Silicon Nitride ($Si_3N_4$), spin-on glass and Silicon (Si). Metal 111 may be homogeneous or include a combination of metals. As shown in FIG. 2B, the stacked structure of FIG. 2A may be patterned and trenches 113, 114 may be etched to create isolated horizontal metal lines in each layer. As indicated above, it should be noted that the terms horizontal and vertical, and any reference to a dimension or coordinate system are provided solely for facilitating an understanding of the three-dimensional crossbar array and the fabrication method thereof. The trenches 113, 114 may be filled with an insulator, such as, for example, $SiO_2$, and planarized, for example, by chemical mechanical polishing (CMP) to level the surface. Referring to FIG. 2C, the stacked crossbar array 110 may be pattered and holes 115, 116, may be etched to define vias that contact and overlap horizontal metal lines 117-119 of each layer of the metal 111. The holes 115, 116 forming the vias may be circular, oval or another shape. As shown in FIG. 2C, the holes 115 may contact the metal lines 117, 118 of each layer of the metal 111 on both sides of each via, and the holes 116 may contact the metal lines 119 of each layer of the metal 111 on one side of the via. The holes 116 constituting the vertical lines of the stacked crossbar array 110 may be filled by coating the inner surface of the via holes with a thin transition metal oxide (TMO) film 120 and filling the interior with a metal core 121. The TMO film 120 may be formed of materials such as, for example, $TiO_2$, $Ta_2O_5$ or its reduced variants, such as, for example, TaOx, NiO, ZnO, ZrO, $HfO_2$, and $Al_2O_3$, and may function as the memristive switching material. The intersection of the horizontal conductive line (terminal 1), the metallic portion of the vertical via line (terminal 2), and the TMO coating of the via lines sandwiched in between these metallic elements, combined operate as a two-terminal resistive switching device in which the states of the device may be defined by the resistive state of the TMO film(s) that were subjected to electrical stimuli by the metallic terminal contacts. To achieve a different type of two-terminal device, such as, for example, a magnetoresistive memory (MRAM) element, the interior surfaces of the vias may be coated by other types of films, such as, for example, ferromagnetic, ferroelectric, and insulating thin films, and the composition of the horizontal lines may change accordingly. The metal core 121 may be homogeneous or include a combination of metals, such as, for example, Tungsten, Titanium Nitride and Tantalum Nitride. The metal core 121 may allow current to flow through all or some of the memristive devices it is in contact with. The overlapped junction between the vias and the metal lines may thus function as a crossbar structure rotated 90°, as described below.

Figure 3:
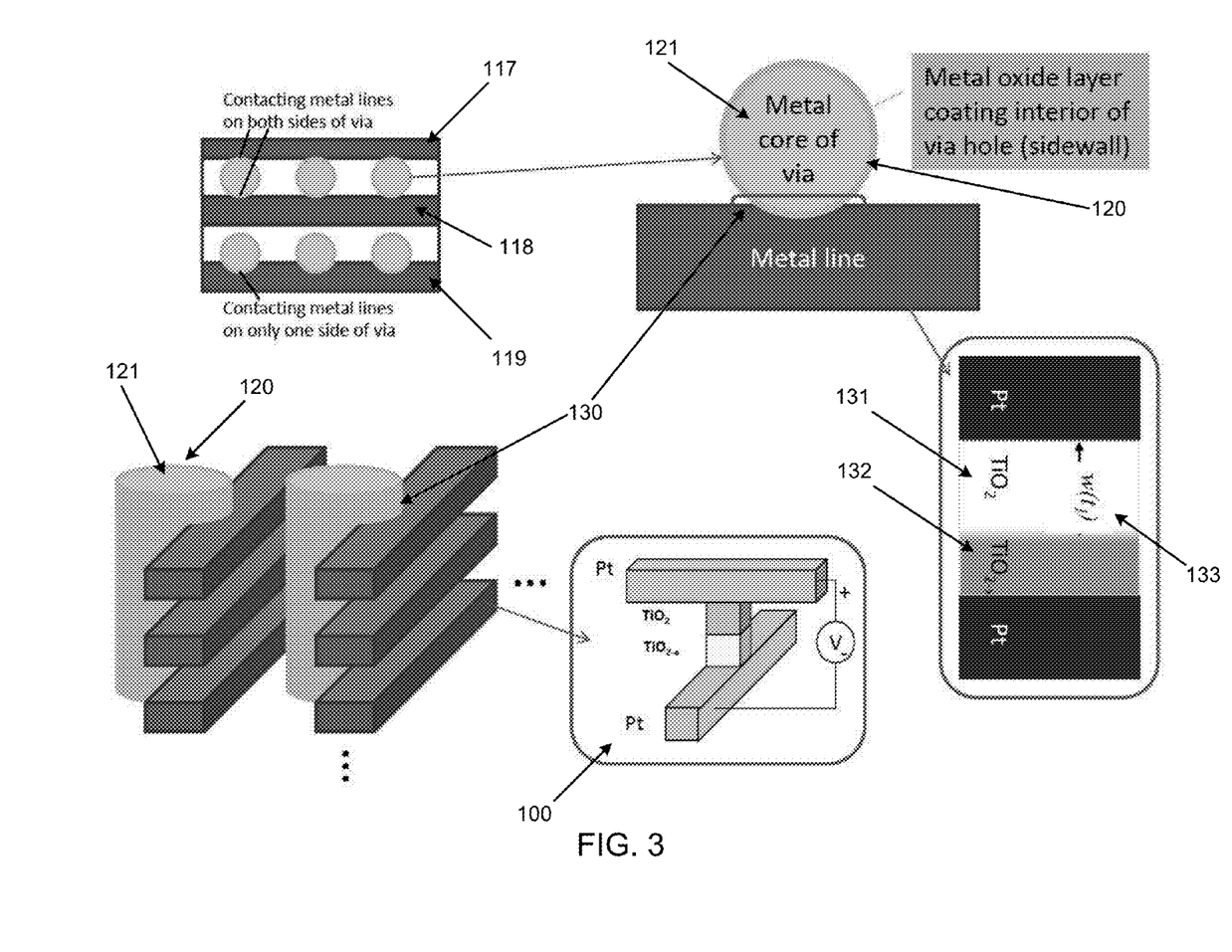
FIG. 3 illustrates a structure of vertical via holes and contacts with horizontal metal lines, according to an embodiment.

Referring to FIGS. 1-3, overlapped junctions shown at 130 in FIG. 3 may function as a crossbar structure rotated 90° (see two-terminal device 100 of FIG. 1). Referring to FIG. 3, the TMO film 120 may function as the memristor switching line layer, and coat the sidewalls of the holes by an atomic layer deposition (ALD) process. When the holes 115, 116 are filled with the metal core 121, a M-I-M structure may be formed in a crossbar configuration between the via and horizontal line. The crossbar configuration may thus include vertical vias formed by the holes 115, 116 and intersect multiple stacked horizontal lines, such as the metal lines 117-119 of FIG. 2C. Compared to the memristor configuration of FIG. 1 which may be considered to have a structure oriented in the X and Y directions, the overlapped junctions shown at 130 of FIG. 3 may be considered to have a structure oriented in the Y and Z directions. The overlapped junctions shown at 130 show that a plurality of layers (e.g., three layers) may be produced by two masking steps. Comparably, for the structure for the two-terminal device 100 of FIG. 1, two or more masking steps may be used to produce one plane of memristors, and for N layers of memristors, the number of masking steps would be based on the number of layers multiplied by the number of masking steps. As described below, other sidewall-coating layers and junction structures may replace the TMO film 120 to realize various two-terminal devices.

Referring to FIG. 3, for the $TiO_2$, $TiO_{2-x}$ layers 131, 132, as discussed above with reference to FIG. 1, the $TiO_{2-x}$ layer 132 may be designated the conductor region and include oxygen vacancies. Under an electric field applied to the electrode 101 adjacent the $TiO_2$ layer, the oxygen vacancies in the $TiO_{2-x}$ layer may migrate into the $TiO_2$ layer 131 towards the electrode 101. Based on migration of the oxygen vacancies through the $TiO_2$ layer 131 towards the electrode 101, the effective size of the $TiO_2$ layer 131 decreases. The gap represented by $w(t_1)$ at 133 may thus be narrowed based on migration of the oxygen vacancies through the $TiO_2$ layer 131, thus increasing conductivity of the junction for providing switching.

Figure 4:
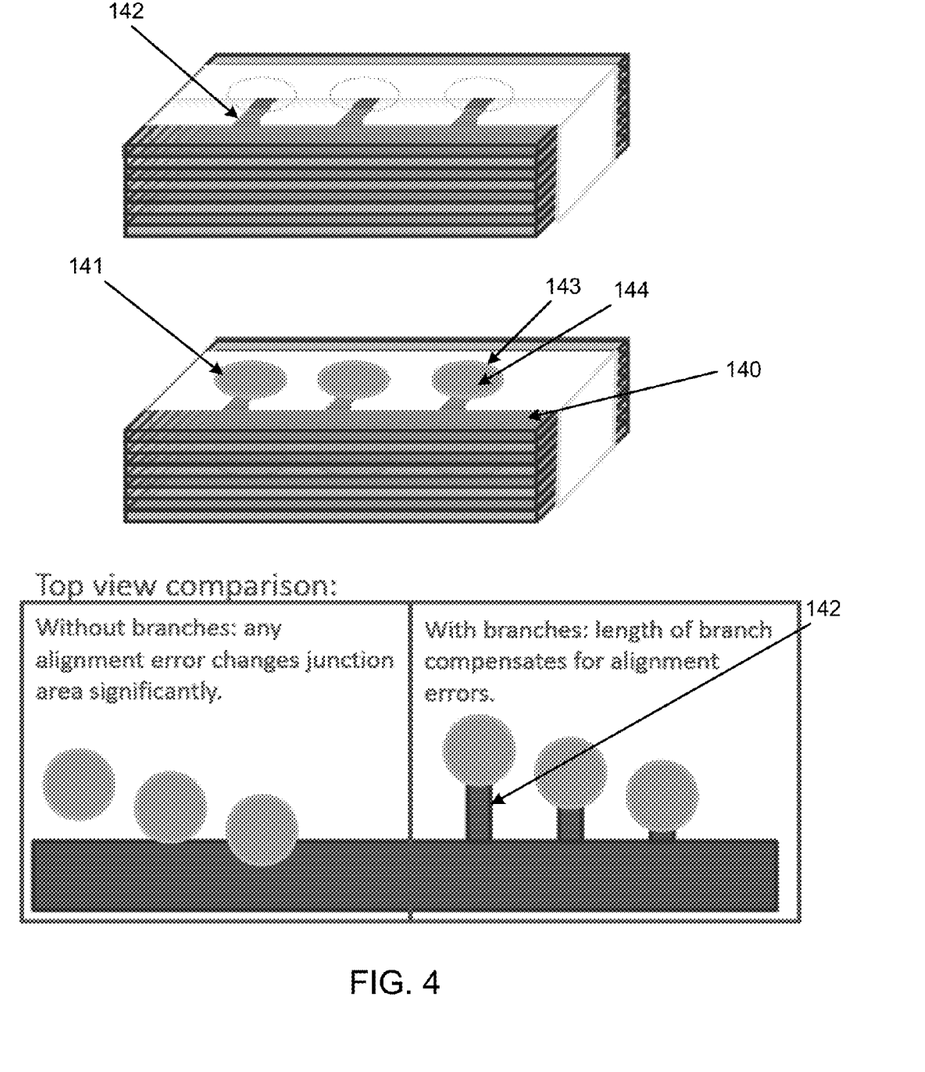
FIG. 4 illustrates a method of providing uniformity of crossbar overlap, according to an embodiment.

Referring to FIG. 4, in order to minimize the affect of misalignment between the edge of the metal lines 140 (similar to the metal lines 117-119 of FIG. 2C) and the vias 141 (similar to the vias of FIG. 2C) in a patterning process and associated variation in overlap between the two, branches 142 may be provided. For example, as shown at the bottom left of FIG. 4, any alignment error may change junction area. The branches 142 may cover the range of misalignment that may be resolved. The holes forming the vias 141 may also be elongated into ovals or other shapes to cover the misalignment in an orthogonal direction. In order to form the branches 142, the metal lines may include the branches 142 that overlap with the holes forming the vias 141. The holes forming the vias 141 may be patterned and etched to define the vias that contact and overlap the branches of the metal lines 140. The interior of the holes forming the vias 141 may be filled with a TMO film 143 (similar to TMO film 120 of FIG. 2C) and metal core 144 (similar to metal core 121 of FIG. 2C). As shown at the bottom right of FIG. 4, the branches 142 may thus increase the margin for error in lithography alignment.

Figure 5A:
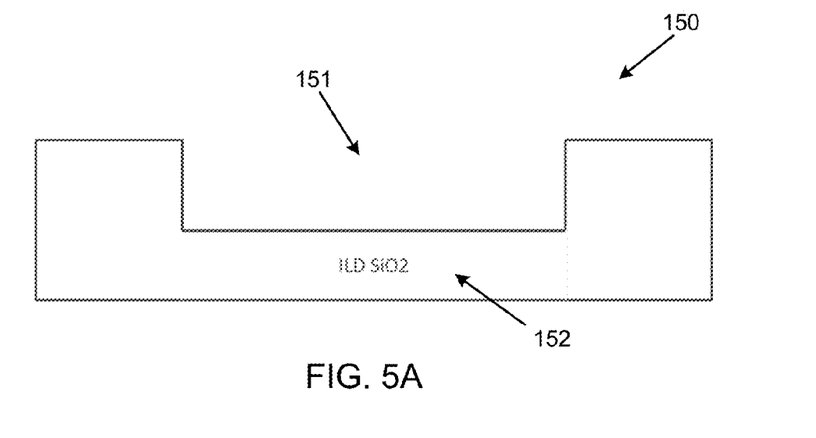
FIGS. 5A and 5B illustrate an integrated three-dimensional crossbar array with isolated contacts and a fabrication method thereof, according to an embodiment.
Figure 5B:
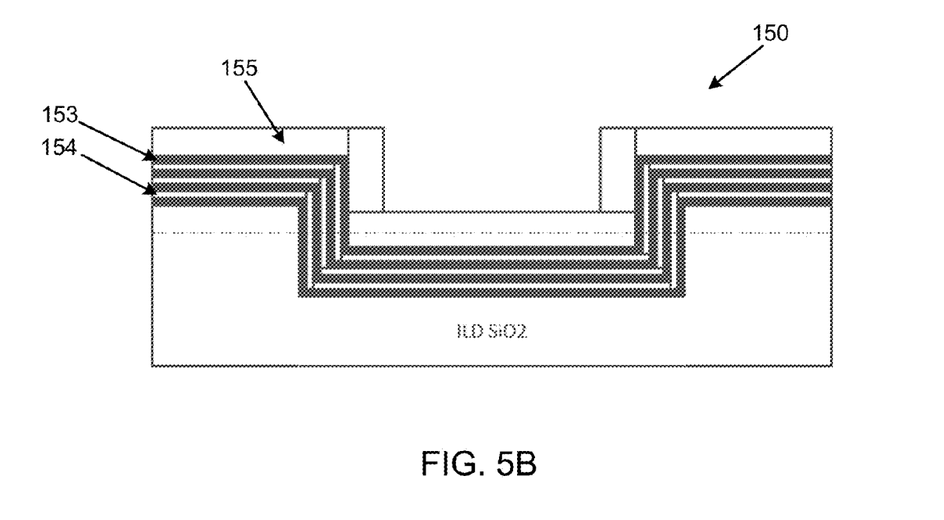

FIGS. 5A-5F illustrate an integrated three-dimensional crossbar array 150 with isolated contacts and a fabrication method thereof, according to an embodiment. The fabrication method described herein may allow the metal lines to be contacted without excessive lithography. Compared to the crossbar array 110 of FIGS. 2A-2C for which the trenches 113, 114 are defined after deposit of the layers 111, 112, for FIGS. 5A and 5B (and further FIGS. 5C-5F), a trench 151 may be defined before deposit of the layers. The crossbar array 150 of FIGS. 5A-5F provides a structure that may be integrated and contacted outside the substrate. If the multiple layers were to be stacked in parallel, additional lithography may be needed to etch vias to contact each layer. In order to avoid this, the parallel layers may be bent over a stepped structure such that segments of the layers may point vertically. CMP may then expose the segment ends, which can then be simultaneously contacted in one or two lithography steps. Thus as shown in FIG. 5A, which shows a side view of the crossbar array 150, the trench 151 may be defined into an inter layer dielectric (ILD) $SiO_2$ substrate 152. The width of the trench 151 may be greater than the intended length of the metal lines. The length of the trench 151 may be indefinite, and in the configuration of FIG. 5A, the length may span the width of the substrate 152. Referring to FIG. 5B, which shows a side view of the crossbar array 150, multiple alternating metallic and ILD films 153, 154 may be deposited over the trench 151. As shown in FIG. 5B, once the metallic and ILD films 153, 154 have been deposited, the structure may be capped with a thick insulator layer 155, such as, for example, Silicon Dioxide ($SiO_2$), Silicon Nitride ($Si_3N_4$), spin-on glass and Silicon (Si).

Figure 5C:
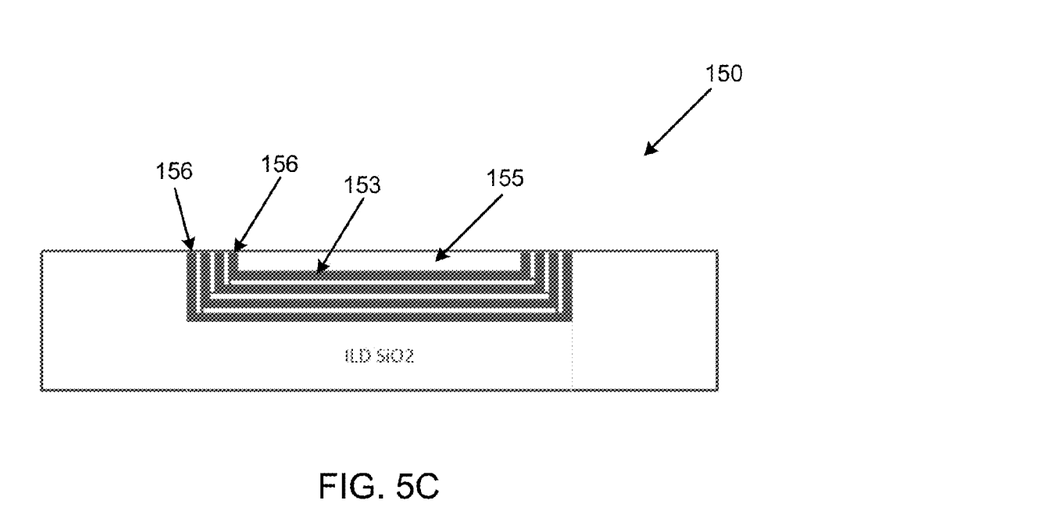
FIGS. 5C and 5D illustrate planarization of a film stack for the crossbar array of FIGS. 5A and 5B, exposing vertical edges of metal film layers, according to an embodiment.
Figure 5D:
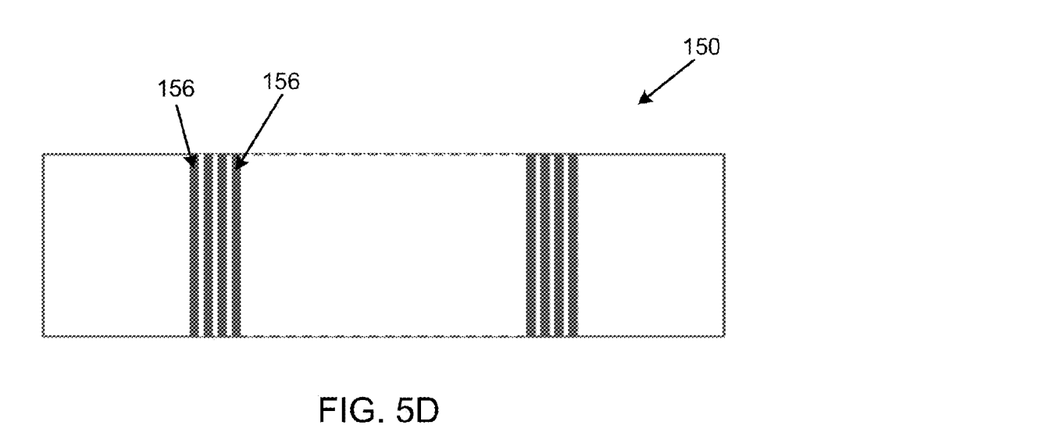

FIGS. 5C and 5D illustrate planarization of a film stack, exposing vertical edges of metal film layers. Referring to FIG. 5C, which shows a side view of the crossbar array 150, after planarization by CMP, vertical edges 156 of the metal films 153 may be exposed. The metal lines thus fabricated may be contacted from the top surface at the exposed vertical edges 156. FIG. 5D shows a top view of the crossbar array 150. The planarization results in the majority of the length of the metal films to be buried in the remaining insulator layer 155.

Figure 5E:
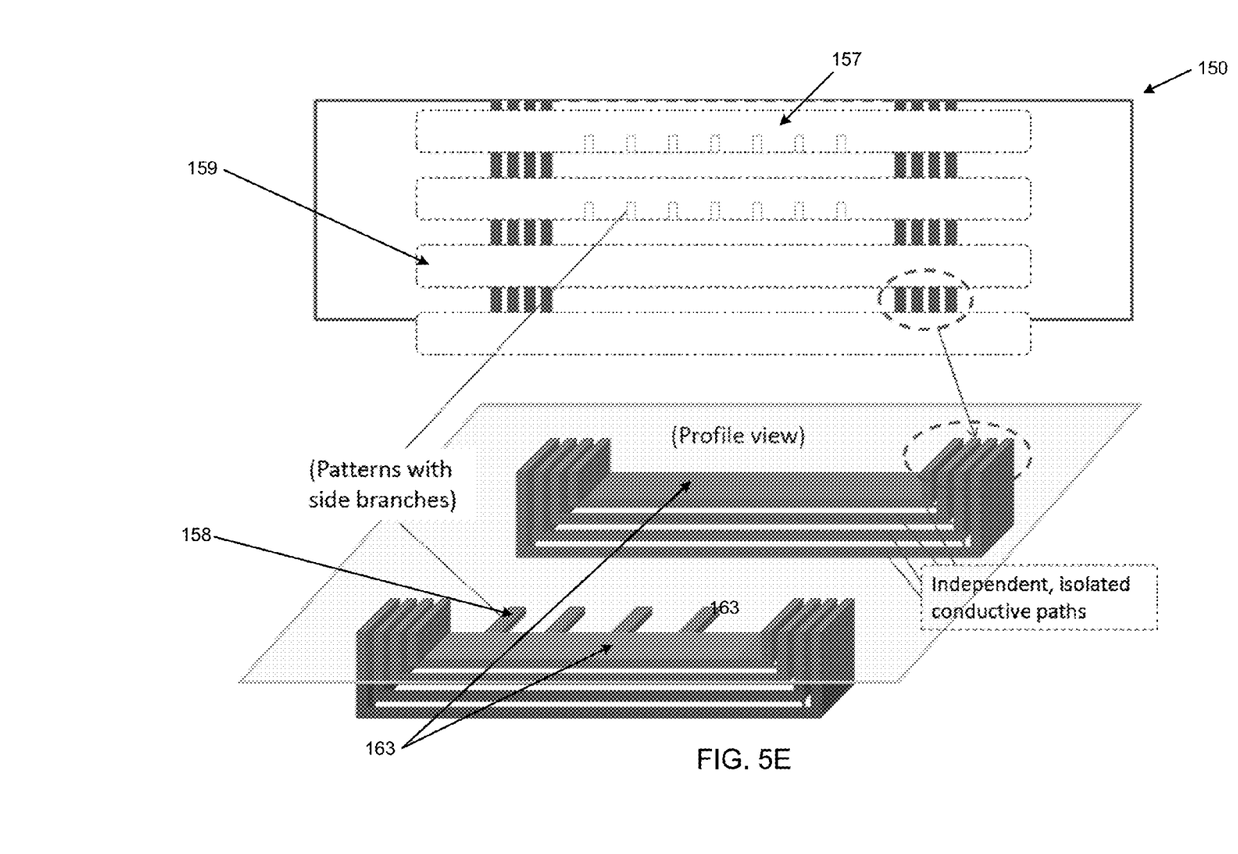
FIG. 5E illustrates etching of horizontal trenches to separate metallic lines and filling with (inter-layer dielectric) ILD for the crossbar array of FIGS. 5A and 5B, according to an embodiment.

FIG. 5E illustrates etching of trenches to separate metallic lines and filling with (inter-layer dielectric) ILD. Referring to FIG. 5E, which shows a top view of the crossbar array 150, trenches 157 may be etched to separate the metal film layers 153. The trenches 157 may include side branches 158 and trenches 159 may be etched without side branches. The trenches 157, 159 may be filled with an insulator, and planarized to level the surface. Compared to the configuration of FIG. 2C that includes holes 115, 116 forming the vias, the vertical edges 156 provide additional contacts as described below.

Figure 5F:
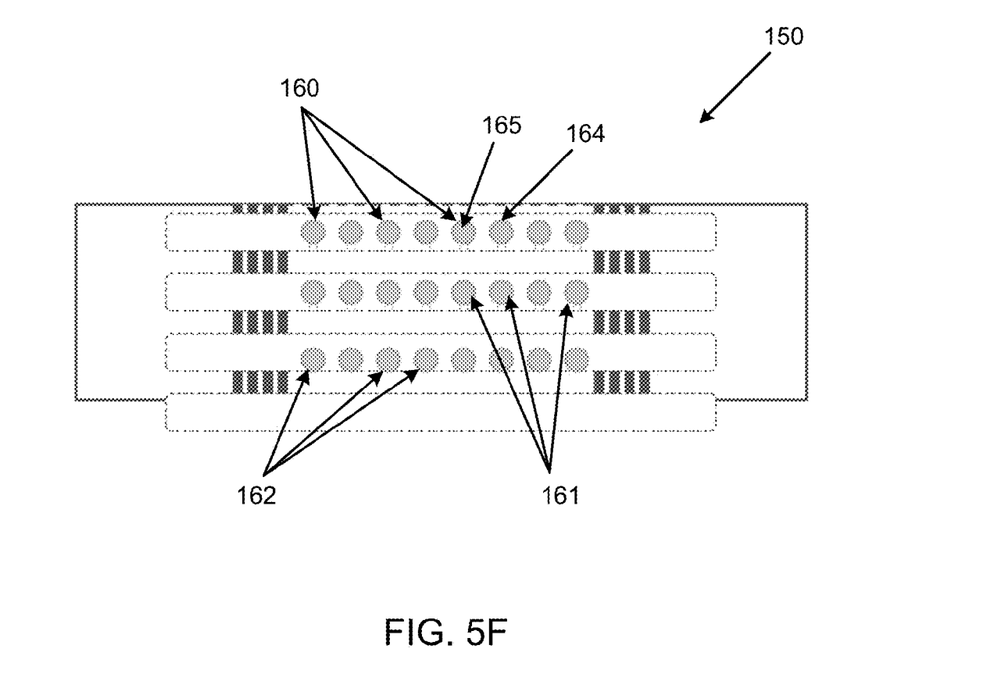
FIG. 5F illustrates patterning and etching of holes to define vias, and coating the interior of via holes for the crossbar array of FIGS. 5A and 5B, according to an embodiment.

FIG. 5F illustrates patterning and etching of holes to define vias, and coating the interior of via holes. Referring to FIG. 5F, holes 160, 161 and 162 forming the vias may be etched, overlapping metal lines 163 (see FIG. 5E) or branches 158 in a similar manner as FIG. 2C. The etched holes may be filled with a TMO film 164 and metal core 165. In the configuration of FIG. 5F, the number of devices fabricated in the area would thus include 96 devices (e.g., 4 metal layers)×(3 metal lines contacted)×(8 via holes per line)). Although the lateral lithography density may be reduced from the spacing needed for the fabrication scheme described herein (e.g., with the branches 158), the layer stacking and vertical integration allows for increased density based on number of layers. Moreover, the integration of FIGS. 5A-5F may be achieved in three mask steps regardless the number of layers.

Figure 6A:
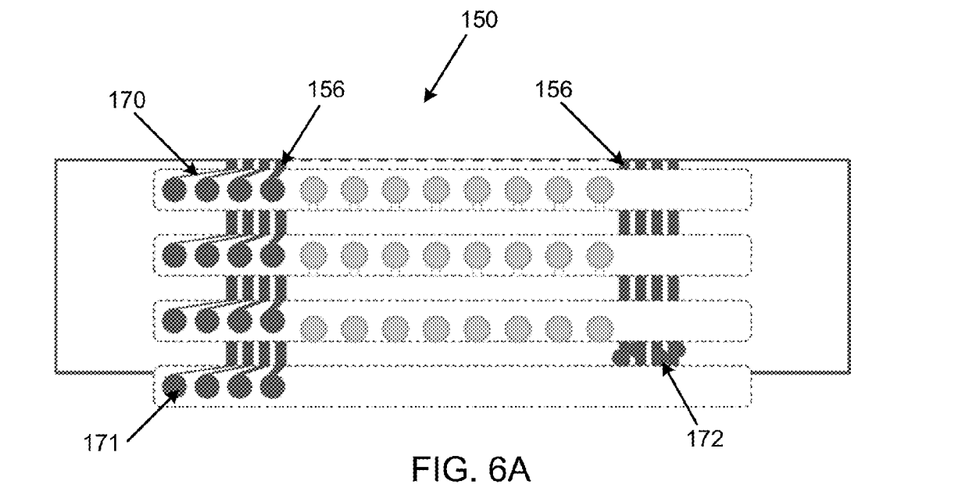
FIG. 6A illustrates contacting of stacked horizontal lines for an integrated three-dimensional crossbar array, according to an embodiment.

FIG. 6A illustrates contacting of stacked metal lines for the integrated three-dimensional crossbar array 150. Referring to FIG. 6A, the vias formed by the holes 160, 161 and 162 may land directly into the metal line ends. In order to connect to vias coming up from the bottom, lateral fan-out lines 170 may be patterned. The vias may be placed down to the metallic contacts 171. The contacts 171 may be provided such that after filling with ILD (see FIG. 5E), the vias may be etched and contact may be provided with the fan-out lines 170. Thus the exposed vertical edges 156 of the metal film layers 153 may be contacted from above or to vias etched into the adjacent insulating region. Alternatively contacts 172 may be provided for direct contact. For the contacts 172, after covering with ILD (see FIG. 5E), vias may be etched directly to the vertical edges 156 of the metal film layers 153.

Figure 6B:
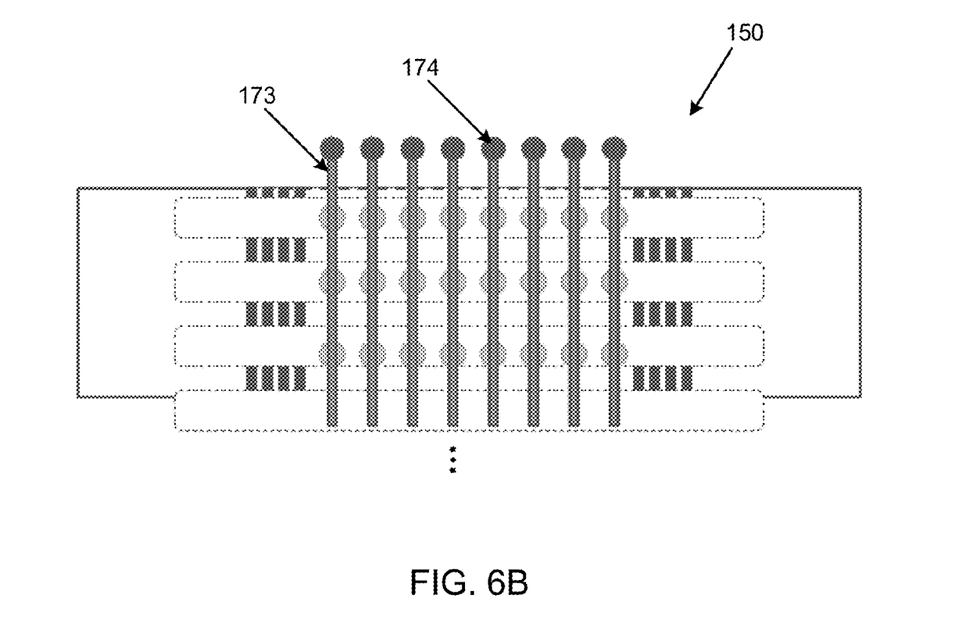
FIG. 6B illustrates contacting of vertical via holes, according to an embodiment.

FIG. 6B illustrates contacting of vertical via holes. Referring to FIG. 6B, the exposed ends of the vias formed by the holes 160, 161 and 162 may be addressed and contacted by patterning a series of metal lines 173 perpendicular to the horizontal metal lines (as seen from the top view) that connect to the exposed top ends of the vias. The metal lines 173 may be contacted at 174 to control devices at the substrate level or externally by vias.

Figure 7A:
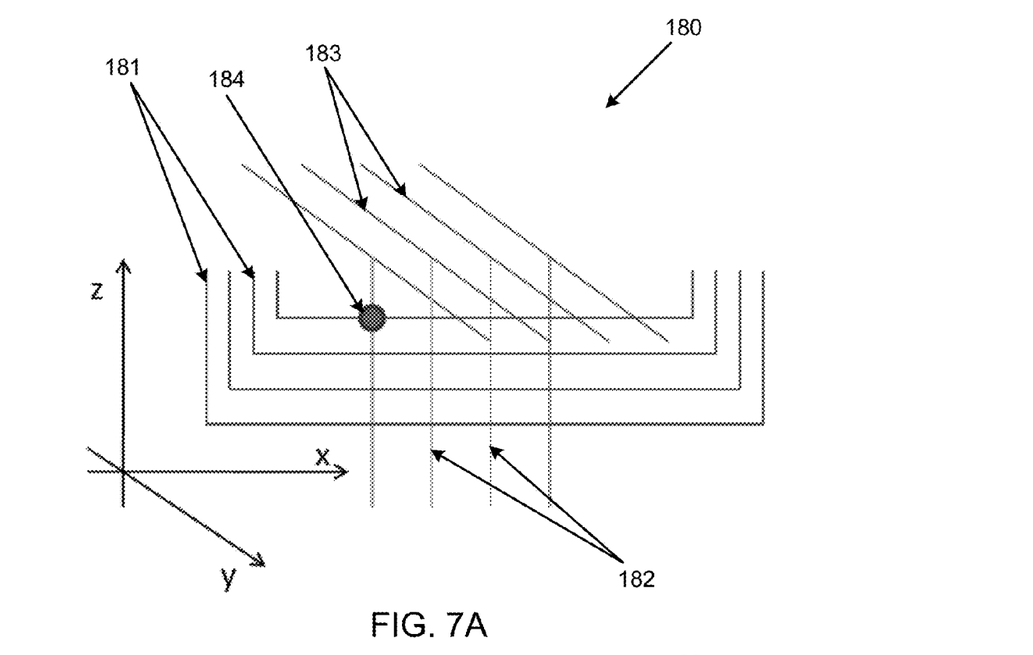
FIGS. 7A and 7B illustrate addressing of an integrated three-dimensional crossbar array, according to an embodiment.

FIG. 7A illustrates addressing of an integrated three-dimensional crossbar array 180. Generally, for the addressing scheme described in further detail below, the horizontal metal lines (oriented along the x axis) may be arrayed in a matrix of vertical stacks (z) and lateral columns (y) and are each contacted independently, and the vertical vias (oriented along the z axis) may be connected and bundled by contact lines (on the top surface) running in the y-direction. Specifically, referring to FIG. 7A, for the crossbar array 180, each device may be addressed by a horizontal metal line 181, a vertical via line 182, which in turn is connected to an orthogonal contact line 183. As shown in FIG. 7A, the stacked horizontal metal lines 181 extend in the x-direction. The horizontal metal lines 181 may be stacked in the z-direction and lined up in the y-direction. The via lines 182 (coated with the metal oxide sidewall) may be in the z-direction, and share a contact line (e.g., the contact line 183) going in the y-direction. An example of a junction 184 (e.g., a memristor device) is illustrated connecting a horizontal metal line to a via line. Each device may be therefore uniquely addressed by a signal applied to the horizontal metal line 181 and a signal applied to the contact line 183 that connects to a group of vertical vias.

Figure 7B:
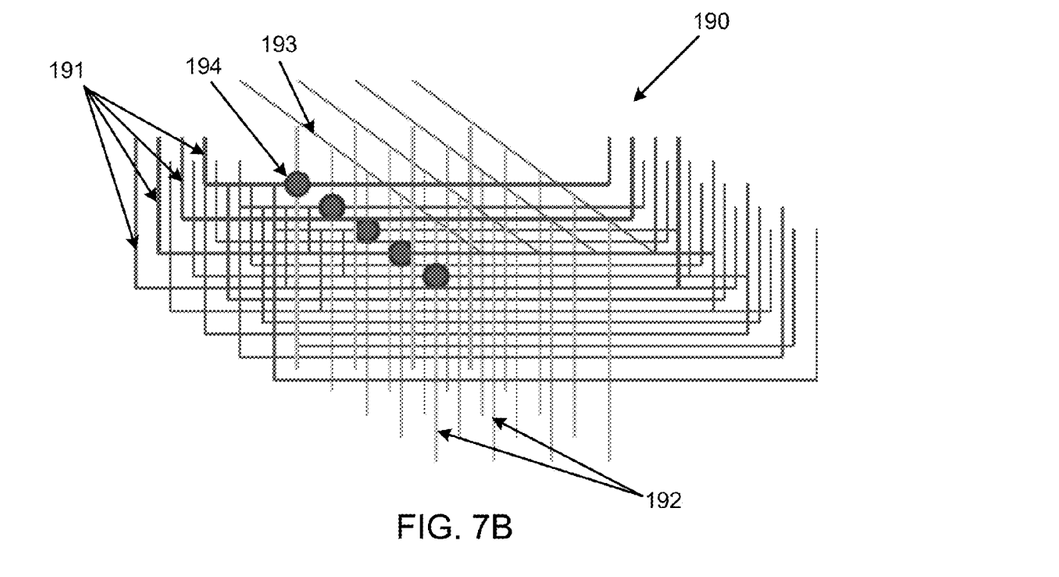

FIG. 7B illustrates addressing of an integrated three-dimensional crossbar array 190. Referring to FIG. 7B, for the crossbar array 190, each device may be addressed by a horizontal metal line 191 independently addressed from the set of horizontal metal lines shown, a respective vertical via line 192, which in turn is connected to a respective orthogonal contact line 193. Examples of junctions 194 (e.g., a memristor device) are illustrated connecting a horizontal metal line to a via line. Assuming the left-most junction 194 in the FIG. 7B configuration is to be addressed, a pulse may be applied to the left-most contact line 193, and the top-most horizontal metal line 191 (four horizontal metal lines labeled in FIG. 7B). Thus a contact line 193 may link to other junctions via other vertical via lines 192. Thus for the left-most junction 194, addressing the left-most contact line 193, and the top-most horizontal metal line 191 is sufficient to address the left-most junction 194.

Figure 8:
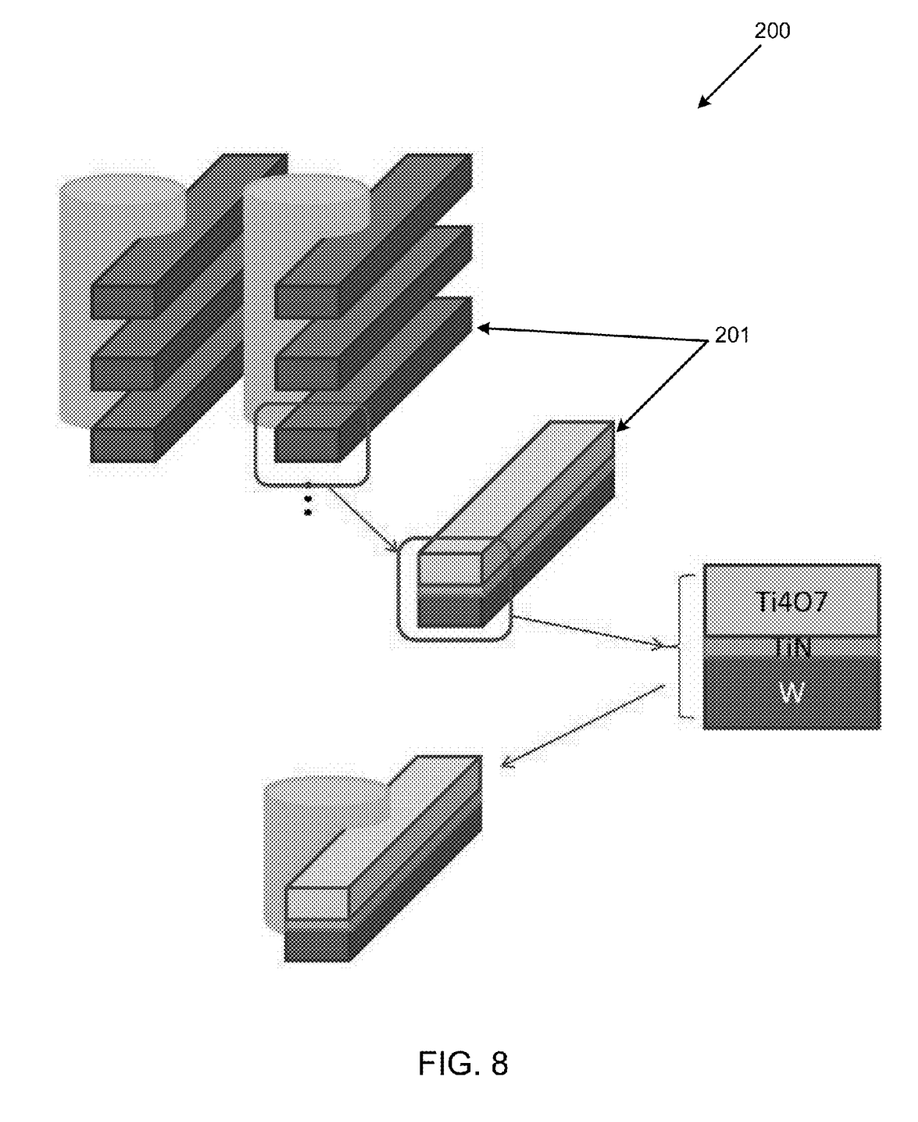
FIG. 8 illustrates multiple component horizontal lines, according to an embodiment.

As shown in FIG. 8 and discussed above with reference to FIG. 2A, a stacked crossbar array may include deposited alternating layers of metal, such as, for example, Platinum (Pt), Titanium Nitride (TiN), Tungsten (W), Copper (Cu), Tantalum Nitride (TaN), Titanium (Ti), Tantalum (Ta), Aluminum (Al) and metal oxides such as, for example, Ti4O7, and insulator, such as, for example, Silicon Dioxide ($SiO_2$), Silicon Nitride ($Si_3N_4$), spin-on glass and Silicon (Si). The metal may be homogeneous or include a combination of materials. The combinations of materials may include, for example, a vacancy-rich metal oxide that serves as a vacancy and/or oxygen source, and a metal that forms a Schottky barrier with the switching layer. These combinations may be provided in addition to the main conductor metal layer. For example, as shown in FIG. 8, the diagram of a stacked crossbar array 200 illustrates metal layers 201 including Titanium Nitride (TiN), Tungsten and Ti4O7. For the foregoing examples of metals, Titanium Nitride may be more robust compared to Tungsten or Copper. Ti4O7 may be an example of a vacancy-rich metal oxide that serves as a vacancy and/or oxygen source. TiN may be an example of an interface metal, and Tungsten may be an example of the main conductor. By using $TiO_2$ or Ti4O7, a reservoir of oxygen vacancies may be provided to the transition metal oxide layer that coats the interior of the via hole. The multiple components may be deposited sequentially and processed (e.g., etched) simultaneously. For trench etching, use of Tungsten or Copper may facilitate lateral undercutting or etching.

Figure 9:
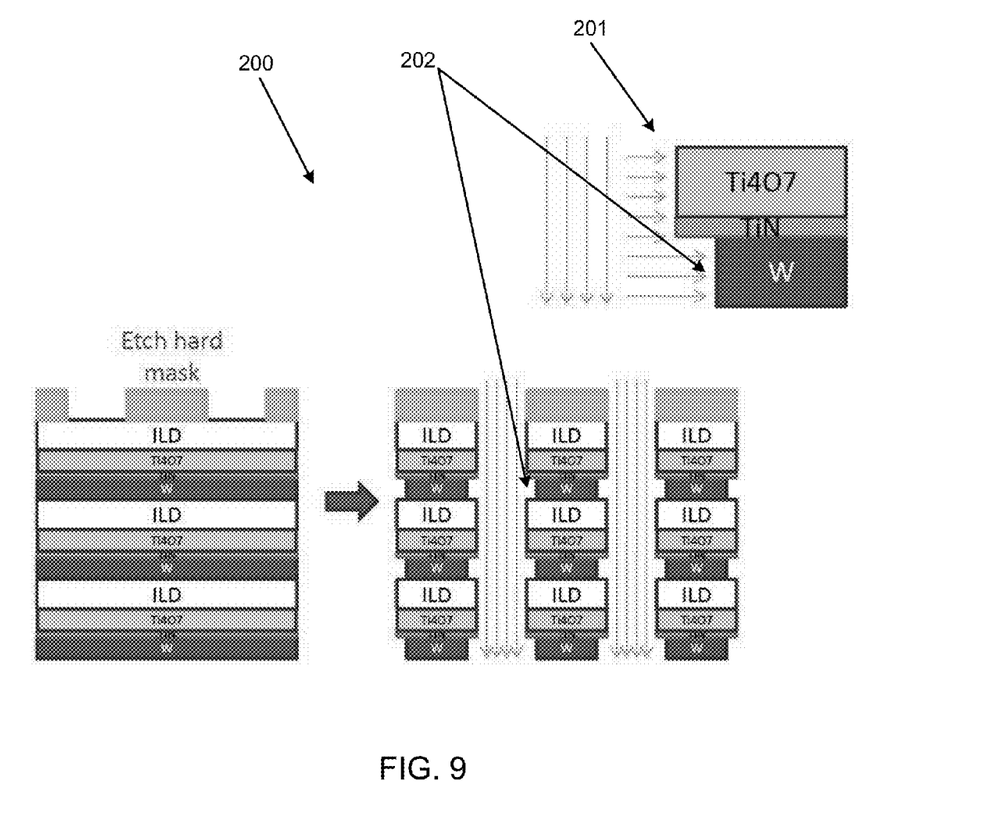
FIG. 9 illustrates etching of multi-component thin film stacks, according to an embodiment.

Referring to FIG. 9, when such multi-component thin film stacks are etched through during line patterning, the difference in the etch rates can result in a selective lateral underetching of the layers. As shown in FIG. 9 at 202, in some etch chemistries, Tungsten may etch significantly faster than TiN or Ti4O7. The use of such metal combinations may facilitate control of the switching functionality of a device.

Figure 10:
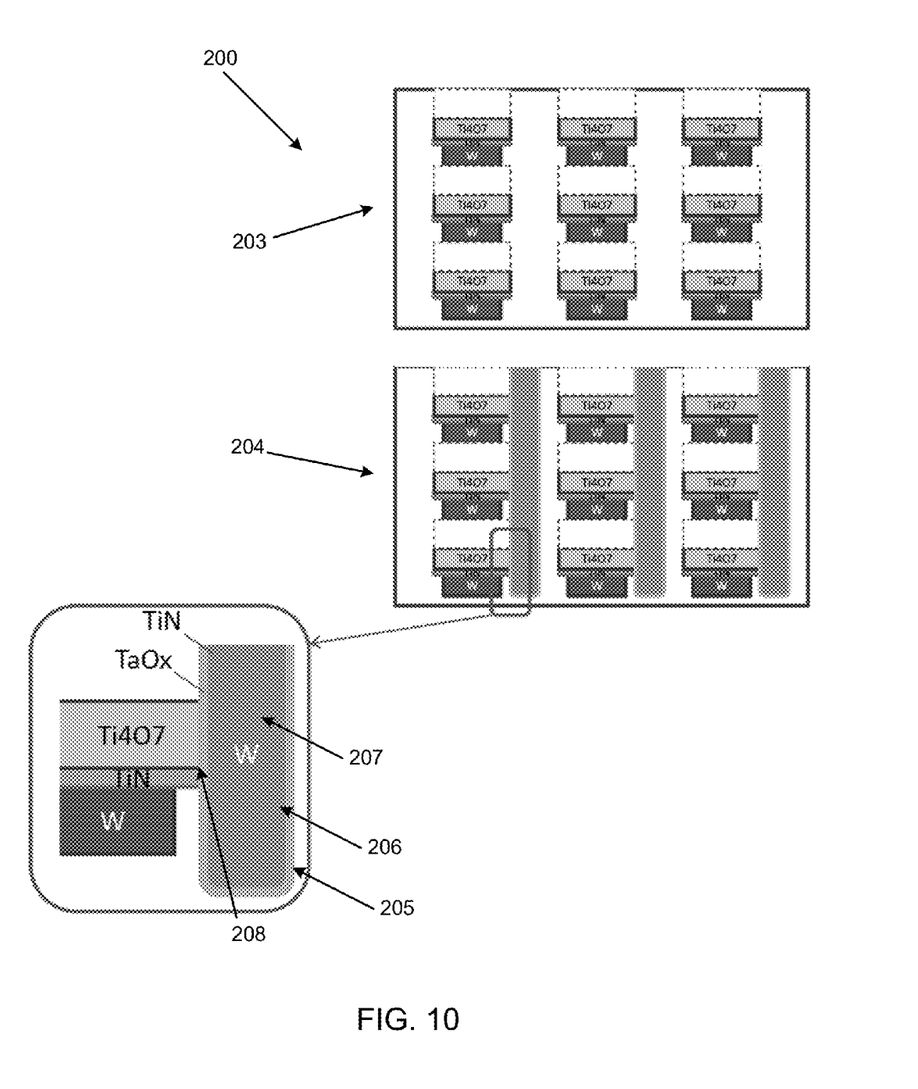
FIG. 10 illustrates deposit of filling insulator into etched trenches and planarization, according to an embodiment.

Referring to FIG. 10, at 203, the stacked crossbar array 200 is shown after the filling insulator is deposited into the etched trenches and planarized. At 204, vertical vias may be etched through and contact the edges of the metal lines. The inside of the via holes may be coated with the switching oxide and a barrier metal, and the interior of the holes may be filled with a metal. For example, the TMO film 205 may be formed of $TiO_2$ and/or Tantalum Oxide (TaOx), and include an inner layer 206 formed of TiN between the TMO film and metal core 207. This configuration provides contact to be selectively made with the protruding components of the etched lines, and switching may occur at 208.

While the embodiments have been described with reference to examples, various modifications to the described embodiments may be made without departing from the scope of the claimed embodiments.

What is claimed is:

1. A stacked crossbar array comprising:
   a plurality of stacked structures, each stacked structure comprising a metal layer and an insulator layer, wherein the plurality of stacked structures are separated from each other by an insulator portion;
   a via disposed in a hole in the insulator portion separating the stacked structures, wherein the hole contacts a metallic edge portion of the metal layer of at least one of the separated stack structures,
   wherein a contact region between the via and the contacted metallic edge portion defines a junction of the stacked crossbar array.

2. The stacked crossbar array of claim 1, wherein the metal layer is formed of a homogeneous material.

3. The stacked crossbar array of claim 1, wherein the metal layer is formed of at least one of Platinum (Pt), Titanium Nitride (TiN), Tungsten (W), Copper (Cu), Tantalum Nitride (TaN), Titanium (Ti), Tantalum (Ta), Aluminum (Al) and Ti4O7.

4. The stacked crossbar array of claim 1, wherein the insulator layer is formed of at least one of Silicon Dioxide (SiO2), Silicon Nitride (Si3N4), spin-on glass and Silicon (Si).

5. The stacked crossbar array of claim 1, wherein the hole contacts the metallic edge portions of at least two of the stacked structures.

6. The stacked crossbar array of claim 1, wherein the hole contacts the metallic edge portion by a branch.

7. The stacked crossbar array of claim 1, wherein the hole includes one of a circular and oval cross-section.

8. The stacked crossbar array of claim 1, wherein an inner surface of the hole includes a transition metal oxide film.

9. The stacked crossbar array of claim 1, wherein an inner surface of the hole includes a transition metal oxide film formed of at least one of Titanium Dioxide (TiO2) and Tantalum Oxide (TaOx).

10. The stacked crossbar array of claim 1, wherein the via includes a metal core.

11. The stacked crossbar array of claim 1, further comprising a plurality of alternating insulator and metal layers disposed adjacent each other in each stacked structure.

12. A stacked crossbar array comprising:
   an insulator substrate including a trench;
   a plurality of stacked structures in the trench, each stacked structure comprising a metal layer and an insulator layer, wherein the plurality of stacked structures are separated from each other by an insulator portion and each metal layer is in a shape of the trench;
   a via disposed in a hole in the insulator portion separating the stacked structures, wherein the hole contacts a metallic edge portion of the metal layer of at least one of the separated stack structures,
   wherein a contact region between the via and the contacted metallic edge portion defines a junction of the stacked crossbar array.

13. A method of fabricating a stacked crossbar array, the method comprising:
   forming a plurality of stacked structures, each of the stacked structures comprising alternating layers of a metal layer and an insulator layer, the plurality of stacked structures separated from each other by an insulator portion;
   forming a hole in the insulator portion separating the stacked structures, the hole contacting an edge portion of each of the metal layers of at least one of the separated stack structures; and
   forming a via in the hole,
   wherein a contact region between the via and a contacted edge portion of each metal layer defines a junction of the stacked crossbar array.

14. The method of claim 13, further comprising forming the metal layer from a homogeneous material.

15. The method of claim 13, further comprising forming the metal layer from a heterogeneous material including at least one of Platinum (Pt), Titanium Nitride (TiN), Tungsten (W), Copper (Cu) and Ti4O7.

16. The method of claim 13, further comprising forming the insulator layer from Silicon Dioxide (SiO2).

17. The method of claim 13, further comprising forming the hole to contact at least two sections of the metal layer.

18. The method of claim 13, further comprising forming the hole to contact a section of the metal layer by a branch.

19. The method of claim 13, wherein a number of masking steps used for forming the crossbar array is independent of a number of metal and insulator layers of the crossbar array.

20. The stacked crossbar array of claim 12, further comprising a plurality of alternating insulator and metal layers disposed adjacent each other in each stacked structure.

* * * * *

UNITED STATES PATENT AND TRADEMARK OFFICE
CERTIFICATE OF CORRECTION

PATENT NO. : 8,803,212 B2
APPLICATION NO. : 13/209606
DATED : August 12, 2014
INVENTOR(S) : Cho It is certified that error appears in the above-identified patent and that said Letters Patent is hereby corrected as shown below:

In the Claims

Column 8, line 55, Claim 3, delete "Ti4O7." and insert -- $Ti_4O_7$. --, therefor.

Column 8, line 57, Claim 4, delete "(SiO2)," and insert -- $(SiO_2)$, --, therefor.

Column 8, line 58, Claim 4, delete "(Si3N4)," and insert -- $(Si_3N_4)$, --, therefor.

Column 9, line 3, Claim 9, delete "(TiO2)" and insert -- $(TiO_2)$ --, therefor.

Column 10, line 15, Claim 15, delete "Ti4O7." and insert -- $Ti_4O_7$. --, therefor.

Column 10, line 17, Claim 16, delete "(SiO2)." and insert -- $(SiO_2)$. --, therefor.

Signed and Sealed this
Tenth Day of February, 2015

Michelle K. Lee
*Deputy Director of the United States Patent and Trademark Office*